(12) United States Patent
Templier et al.

(10) Patent No.: US 12,329,017 B2
(45) Date of Patent: Jun. 10, 2025

(54) OPTOELECTRONIC DEVICE MANUFACTURING METHOD

(71) Applicant: Commissariat à l'Énergie Atomique et aux Énergies Alternatives, Paris (FR)

(72) Inventors: François Templier, Grenoble (FR); Roch Espiau de Lamaestre, Grenoble (FR); Tony Maindron, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 501 days.

(21) Appl. No.: 17/888,852

(22) Filed: Aug. 16, 2022

(65) Prior Publication Data

US 2023/0054679 A1 Feb. 23, 2023

(30) Foreign Application Priority Data

Aug. 19, 2021 (FR) ........................................ 2108773
Oct. 28, 2021 (FR) ........................................ 2111478

(51) Int. Cl.
| | | |
|---|---|---|
| H10K 59/65 | (2023.01) | |
| H10F 39/00 | (2025.01) | |
| H10F 39/18 | (2025.01) | |
| H10K 59/12 | (2023.01) | |
| H10K 71/00 | (2023.01) | |

(52) U.S. Cl.
CPC ........... *H10K 59/65* (2023.02); *H10F 39/018* (2025.01); *H10K 71/00* (2023.02); *H10F 39/021* (2025.01); *H10F 39/1843* (2025.01); *H10F 39/811* (2025.01); *H10K 59/12* (2023.02); *H10K 59/1201* (2023.02)

(58) Field of Classification Search
CPC ........ H10K 59/65; H10K 71/00; H10K 59/12; H10K 59/1201; H10F 39/018; H10F 39/021; H10F 39/1843; H10F 39/811
See application file for complete search history.

(56) References Cited

U.S. PATENT DOCUMENTS

| | | | |
|---|---|---|---|
| 2018/0226595 A1 | 8/2018 | Liu | |
| 2019/0346939 A1* | 11/2019 | Na | ........................ G06F 3/0418 |
| 2022/0375913 A1* | 11/2022 | Templier | ............... H01L 25/167 |
| 2024/0074283 A1* | 2/2024 | Tsukamoto | .............. G02B 5/20 |

FOREIGN PATENT DOCUMENTS

| | | |
|---|---|---|
| EP | 3 624 192 A1 | 3/2020 |
| WO | WO 2017/089676 A1 | 6/2017 |
| WO | WO 2018/180577 A1 | 10/2018 |

OTHER PUBLICATIONS

Preliminary Search Report for French Application No. 2108773, dated May 17, 2022.

\* cited by examiner

*Primary Examiner* — J. E. Schoenholtz
(74) *Attorney, Agent, or Firm* — Wolf, Greenfield & Sacks, P.C.

(57) ABSTRACT

An optoelectronic device manufacturing method, including the following successive steps: transferring an active inorganic photosensitive diode stack on an integrated control circuit previously formed inside and on top of a semiconductor substrate; and forming a plurality of organic light-emitting diodes on the active photosensitive diode stack.

19 Claims, 6 Drawing Sheets

OPTOELECTRONIC DEVICE MANUFACTURING METHOD

CROSS-REFERENCE TO RELATED APPLICATIONS

This application claims priority to French application number 21/11478, filed Oct. 28, 2021 and French application number 21/08773, filed Aug. 19, 2021. The contents of these applications are incorporated herein by reference in their entirety.

TECHNICAL BACKGROUND

The present disclosure generally concerns the field of optoelectronic devices, and more particularly aims at a method of manufacturing an optoelectronic device combining a light emission function and an optical capture function.

PRIOR ART

Various applications are likely to benefit from an optoelectronic device combining a light emission function and an optical capture function. Such a device may for example be used to form an interactive display screen.

SUMMARY OF THE INVENTION

An object of an embodiment is to overcome all or part of the disadvantages of known solutions for forming an optoelectronic device combining a light emission function and an optical capture function.

For this purpose, an embodiment provides a method of manufacturing an optoelectronic device, comprising the successive steps of:
 a) transferring an active inorganic photosensitive diode stack onto an integrated control circuit previously formed inside and on top of a first semiconductor substrate; and
 b) forming a plurality of organic light-emitting diodes on the active photosensitive diode stack.

According to an embodiment, the method comprises the forming of a plurality of photosensitive diodes in the active photosensitive diode stack.

According to an embodiment, the method comprises, after step a) and before step b), the forming of conductive contacting vias crossing the active photosensitive diode stack and emerging onto metal connection pads of the integration control circuit.

According to an embodiment, at step a), the active photosensitive diode stack is fixed to the integrated control circuit by direct bonding of a dielectric layer previously deposited on the active photosensitive diode stack, with a dielectric layer previously deposited on the integrated control circuit.

According to an embodiment, the method comprises, after step b), the forming of optical filters or of color conversion elements above the organic light-emitting diodes.

According to an embodiment, the organic light-emitting diodes are monochromatic diodes of same color, at least one of said organic light-emitting diodes being topped with a photoluminescent conversion element adapted to converting the light emitted by the diode into a first visible wavelength and at least another one of said organic light-emitting diodes being topped with a photoluminescent conversion element adapted to converting the light emitted by the diode into a light radiation in the wavelength range detected by said at least one inorganic photosensitive diode, preferably an infrared radiation.

According to an embodiment, at least one of said organic light-emitting diodes is not topped with a photoluminescent conversion element.

According to an embodiment, the organic light-emitting diodes are adapted to mainly emitting blue light.

According to an embodiment, the photoluminescent conversion elements are formed based on quantum dots or on perovskite materials.

According to an embodiment, at the end of step a), the active photosensitive diode stack extends continuously over the entire surface of the control circuit.

According to an embodiment, the active photosensitive diode stack comprises at least one inorganic semiconductor layer made of a III-V material.

According to an embodiment, the active photosensitive diode stack comprises first, second, and third semiconductor layers, the second layer being arranged between the first and third layers, and the third layer being arranged on the side of the integrated control circuit at the end of step a).

According to an embodiment, the method comprises a step of P-type doping of local portions of the first layer, said portions defining anode regions of photosensitive diodes of the device.

According to an embodiment, said step of P-type doping of local portions of the first layer is implemented after step a) and before step b).

According to an embodiment, the method further comprises, after said step of P-type doping of local portions of the first layer and before step b), a step of forming of connection metallizations on top of and in contact with said local portions of the first layer.

According to an embodiment, the method comprises, after step b), a step of bonding of a temporary support substrate onto the side of a surface the device opposite to the integrated circuit, followed by a step of cutting of the assembly comprising the integrated circuit, the active photosensitive diode stack, and the organic light-emitting diodes into a plurality of elementary chips.

According to an embodiment, the method further comprises a step of transfer and of bonding of said elementary chips onto a transfer substrate of the device, followed by a step of removal of the temporary support substrate.

An embodiment provides an optoelectronic device comprising, in the order, an integrated control circuit formed inside and on top of a semiconductor substrate, a photodetection stage comprising at least one inorganic photosensitive diode, and an emission stage comprising at least one organic light-emitting diode.

An embodiment provides a device comprising a transfer substrate, and a plurality of elementary chips bonded and electrically connected to the transfer substrate, each elementary chip comprising an optoelectronic device, the integrated control circuit being arranged on the side of the transfer substrate.

Another embodiment provides a system comprising an optoelectronic device such as defined hereabove, and a light source adapted to emitting a light radiation in the wavelength range detected by the inorganic photosensitive diode, preferably an infrared radiation.

According to an embodiment, the light source is a remote source.

According to an embodiment, the light source is integrated to the optoelectronic device and comprises at least one organic light-emitting diode of the emission stage of the optoelectronic device.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Figure 1A:
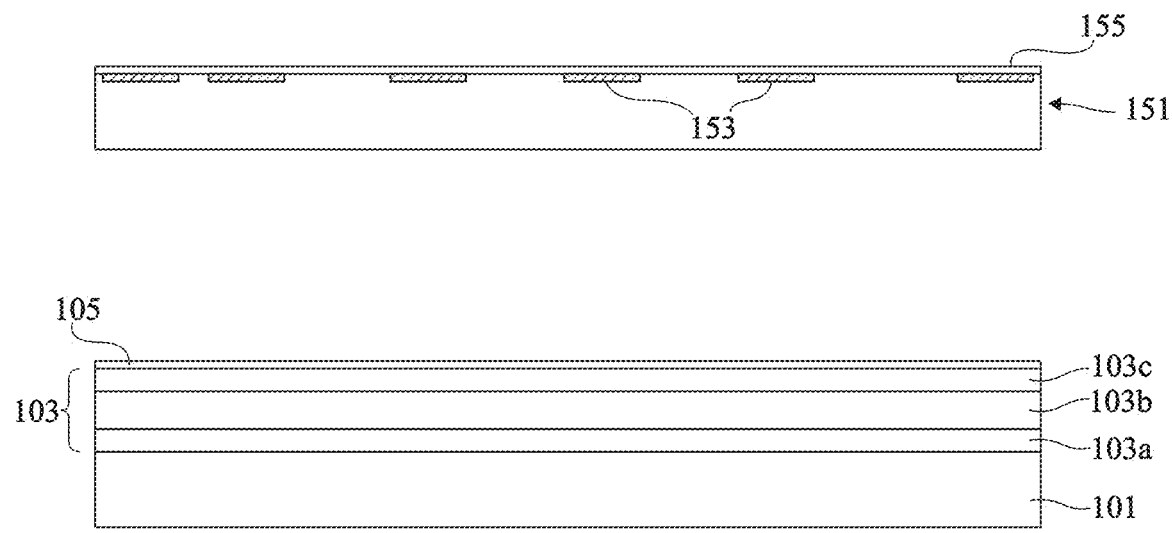
FIGS. 1A, 1B, 1C, 1D, 1E, 1F, 1G, 1H, and 1I are cross-section views illustrating successive steps of an example of an optoelectronic device manufacturing method according to an embodiment.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the photosensitive diodes, of the light-emitting diodes (LED), and of the integrated control circuits of the described devices has not been detailed, the detailed implementation of these elements being within the abilities of those skilled in the art based on the functional indications of the present description. Further, the various applications that the described embodiments may have not been detailed, the described embodiments being compatible with all or most of the applications likely to benefit from a device combining a light emission function and an optical capture function (photodetection).

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred unless specified otherwise to the orientation of the drawings.

Unless specified otherwise, the expressions "around", "approximately", "substantially" and "in the order of" signify within 10%, and preferably within 5%.

According to an aspect of an embodiment, it is provided, to form an optoelectronic device combining a light emission function and a photodetection function, to transfer an active inorganic photosensitive diode stack onto an integrated control circuit previously formed inside and on top of a semiconductor substrate, and then to form a plurality of organic LEDs on the active photosensitive diode stack. The method further comprises, after the transfer of the active inorganic photosensitive diode stack and before the forming of the organic LEDs, the forming of conductive vias crossing the photosensitive diode stack, enabling to electrically connect the active photosensitive diode stack and the organic LEDs to the integrated control circuit.

FIGS. 1A to 1I are cross-section views illustrating successive steps of a non-limiting example of implementation of such a method. Different variants are within the abilities of those skilled in the art based on the indications of the present description.

For simplification, there has been shown in FIGS. 1A to 1I the forming of a device comprising a single photosensitive diode D1 and three organic LEDs L1, L2, L3. In practice, the described methods may of course be used to form devices comprising a much larger number of photosensitive diodes and of organic LEDs.

FIG. 1A very schematically illustrates, in its upper portion, an integrated control circuit 151 formed inside and on top of a semiconductor substrate, for example, a single-crystal silicon substrate. Integrated circuit 151 comprises circuits for controlling and reading the LEDs and the photosensitive diodes of the device. As an example, integrated circuit 151 comprises an assembly of elementary control and readout cells, enabling to individually control each LED and to individually read each photosensitive diode of the device. Integrated circuit 151 is for example a CMOS ("Complementary Metal Oxide Semiconductor") circuit. In this example, circuit 151 comprises a plurality of metal connection pads 153 arranged on its upper surface side, intended to be respectively connected to the anodes and cathodes of the LEDs and of the photosensitive diodes of the device. As an example, pads 153 are flush with the upper surface side of an interconnection stack (not detailed in the drawing) coating the upper surface of the semiconductor substrate of the circuit.

FIG. 1A further schematically illustrates, in its lower portion, the structure obtained at the end of steps of forming of an active photosensitive diode stack 103 on the upper surface of a substrate 101.

Stack 103 is a stack of inorganic semiconductor layers. Stack 103 for example comprises one or a plurality of layers made of a III-V-type semiconductor material. Stack 103 is for example an active photodiode stack sensitive in infrared or near infrared. As a variant, stack 103 is an active photodiode stack sensitive in the visible range. As an example, stack 103 comprises, in the order from the upper surface of substrate 101, a layer 103a made of non-intentionally doped indium phosphide (InP), an absorption layer 103b made of indium-gallium arsenide (InGaAs), for example, intrinsic or lightly N-type doped (for example, in the order of $10^{15}$ atoms/cm$^3$), and a layer 103c made of N-type doped indium phosphide (InP). As an example, the N-type doping level of layer 103c is in the range from $10^{16}$ to $10^{18}$ atoms/cm$^3$. In this example, layer 103b is in contact, by its lower surface, with the upper surface of layer 103a, and layer 103c is in contact, by its lower surface, with the upper surface of layer 103b.

Substrate 101 is for example made of indium phosphide. Layers 103a, 103b, and 103c may be successively formed by epitaxy on the upper surface of substrate 101. Substrate 101 then is a growth substrate. A buffer layer, not shown, for example, made of indium phosphide, may possibly form an interface between substrate 101 and layer 103a. Buffer layer is for example in contact, by its lower surface, with the upper surface of substrate 101, and by its upper surface, with the lower surface of layer 103a. The buffer layer may also be formed by epitaxy from the upper surface of substrate 101, before the forming of layers 103a, 103b, and 103c.

As a variant, rather than forming active photosensitive diode stack 103 by epitaxy on the upper surface of substrate 101, the active stack may be formed in the reverse order on a growth substrate, not shown, and then transferred and bonded onto substrate 101. In this case, layers 103c, 103b, and 103a are successively formed by epitaxy on a surface of the growth substrate. A buffer layer, for example, made of indium phosphide, may possibly form an interface between the growth substrate and layer 103c. Stack 103 is then bonded to the upper surface of substrate 101, for example by direct bonding or molecular bonding of the lower surface of layer 103a onto the upper surface of substrate 101. The growth substrate and, possibly, the buffer layer forming an interface between the growth substrate and layer 103c, may then be removed to clear the access to the upper surface of layer 103c. In this variant, substrate 101 is a support substrate, for example, made of silicon, or of any other material adapted to being used as a support for receiving active stack 103.

At this stage, each of the layers of active photosensitive diode stack 103 extends, for example, continuously and with a substantially uniform thickness, over the entire upper surface of substrate 101.

FIG. 1A further illustrates a step of deposition of a dielectric layer 155, for example, made of silicon oxide, on top of and in contact with the upper surface of integrated control circuit 151. In this example, layer 155 extends continuously and with a substantially uniform thickness over the entire upper surface of integrated control circuit 151.

FIG. 1A further illustrates a step of deposition of a dielectric layer 105, for example made of the same material as layer 155, for example, of silicon oxide, on the upper surface of active photodiode stack 103. As an example, layer 105 is deposited on top of and in contact with the upper surface of layer 103c. Layer 105 for example extends continuously and with a substantially uniform thickness over the entire upper surface of stack 103.

Figure 1B:
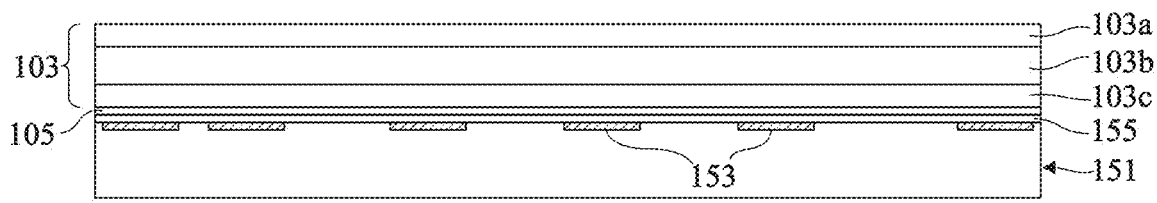

FIG. 1B illustrates the structure obtained at the end of a step of transfer and of bonding of active photosensitive diode stack 103 onto integrated control circuit 151, and then of removal of substrate 101. During this step, active photosensitive diode stack 103 is transferred onto integrated circuit 151, by using substrate 101 as a support handle. In FIG. 1B, the structure comprising substrate 101 and stack 103 is turned upside down with respect to the orientation of FIG. 1A. Stack 103 is then bonded to integrated control circuit 151. In this example, stack 103 is bonded by direct bonding or molecular bonding of the lower surface (in the orientation of FIG. 1B, corresponding to the upper surface in the orientation of FIG. 1A) of layer 105, onto the upper surface of layer 155. Substrate 101 is then removed, for example by grinding and/or chemical etching, to clear the access to the upper surface of layer 103a. At this stage, each of the layers of active photosensitive diode stack 103 extends for example continuously and with a substantially uniform thickness over the entire surface of integrated control circuit 151. It should be noted that, in this example, active stack 103 is non-structured and has been submitted to no step of local treatment before the transfer step. Thus, the transfer step requires no specific alignment.

Figure 1C:
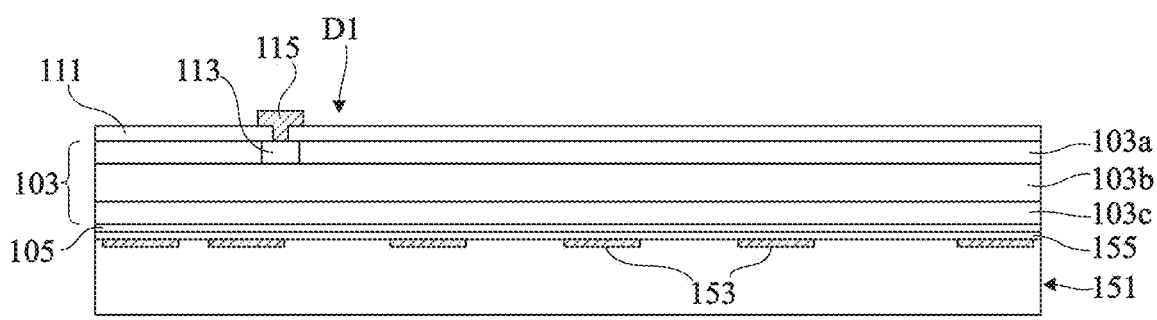

FIG. 1C illustrates the structure obtained at the end of the following successive steps:
  i) deposition of a dielectric layer 111, for example made of silicon nitride or of silicon oxide, on the upper surface of layer 103a, for example, in contact with the upper surface of layer 103a;
  ii) forming of local through openings in dielectric layer 111, in front of futures P-type contacting areas corresponding to anode regions of the photosensitive diodes of the device;
  iii) P-type doping of local regions 113 of layer 103a, located in front of said through openings;
  iv) forming of contacting metallizations 115 in the through openings, each metallization 115 individually contacting the underlying P-type doped region 113, through the corresponding opening.

At step i), dielectric layer 111 is for example deposited by a method of plasma-enhanced chemical vapor deposition (PECVD).

At step ii), the through openings formed in dielectric layer 111 are for example formed by photolithography and etching.

At step iii), the doping of regions 113 may be performed by diffusion or implantation of P-type dopant elements, for example, zinc (Zn) or beryllium (Be), in front of openings formed at step ii). An activation anneal of the dopant elements may then be implemented. As an example, the activation anneal may be a surface laser anneal, which enables not to alter integrated circuit 151, nor to alter the quality of the bonding between integrated circuit 151 and active photosensitive diode stack 103. P-type doped regions 113 form anode regions of the photosensitive diodes of the device. In this example, regions 113 extend across the entire thickness of layer 103a, and come into contact, by their lower surface, with the upper surface of absorption layer 103b.

At step iv), as an example, a metal layer is first continuously deposited over the entire upper surface of the structure, that is, on top of and in contact with the upper surface of dielectric layer 111 and in the openings formed at step ii), and then removed by photolithography and etching while keeping metallizations 115. In this example, each metallization 115 forms an anode electrode of a photosensitive diode D1 of the device.

Figure 1D:
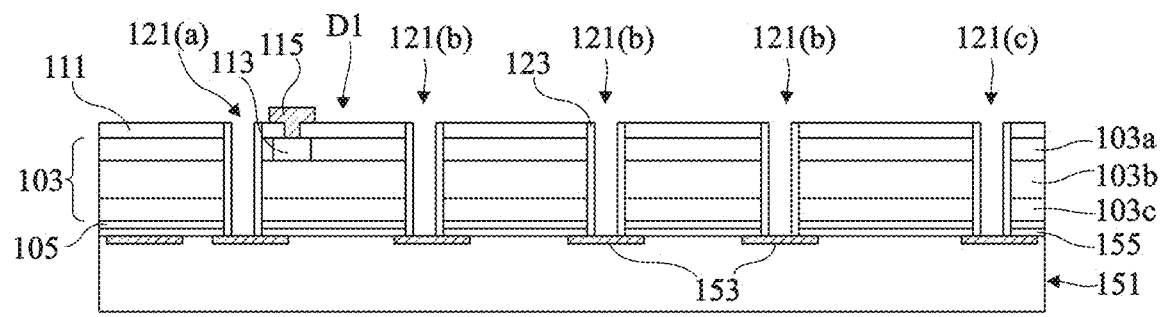

FIG. 1D illustrates the structure obtained at the end of a step of forming, from the upper surface of the structure, of first openings or contacting vias 121 crossing active photosensitive diode stack 103 and emerging onto connection pads 153 of the integrated control circuit. Openings 121 extend vertically from the upper surface of dielectric layer 111 to the upper surface of pads 153, through layers 111, 103a, 103b, 103c, 105, and 155. Openings 121 for example have a circular shape. In this example, for each photosensitive diodes D1, a specific opening 121(a) forming an anode contacting opening of the diode is formed at this step. For each of LEDs L1, L2, L3, a specific opening 121(b) forming an anode contacting opening of the LED is further formed. Further, in this example, an opening 121(c) common to LEDs L1, L2, L3, forming a cathode contacting opening of said LEDs, is formed at this step, for example in a peripheral region of the device. Openings 121(a), 121(b), 121(c) are for example identical to within manufacturing dispersions. In this example, openings 121(a), 121(b), 121(c) are simultaneously formed during a same local etch step. Openings 121(a), 121(b), 121(c) respectively emerge onto distinct metal pads 153 of integrated control circuit 151, to allow the individual control of diodes D1, L1, L2, L3 by circuit 151.

FIG. 1D further illustrates a step of deposition of an electrically-insulating layer 123, for example, made of silicon oxide, on the lateral walls of openings 121(a), 121(b), 121(c). Layer 123 is for example first continuously deposited over the entire upper surface of the structure after the forming of openings 121. The horizontal portions of layer 123 are then removed by vertical anisotropic etching so that only the vertical portions coating the lateral walls of openings 121 remain.

Figure 1E:
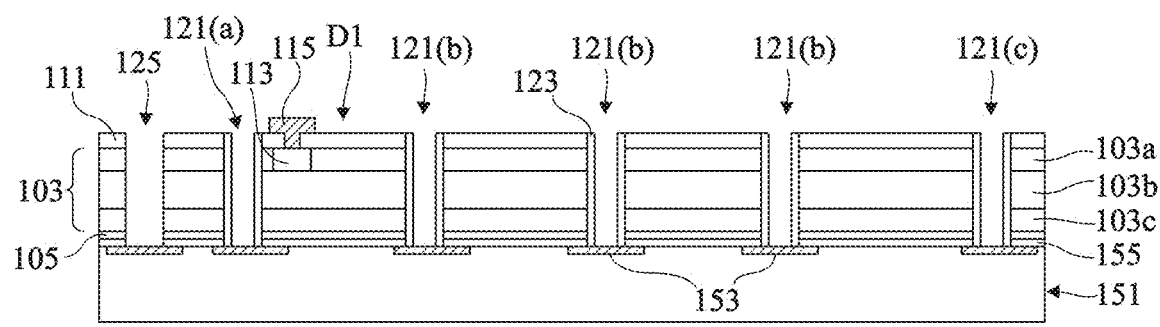

FIG. 1E illustrates the structure obtained at the end of a subsequent step of forming, from the upper surface of the structure of FIG. 1D, of at least a second contacting opening 125 crossing active photosensitive diode stack 103 and emerging onto a connection pad 153 of the integrated control circuit. In the same way as openings 121, opening 125 vertically extends from the upper surface of dielectric layer 111 to the upper surface of the underlying pad 153, through layers 111, 103a, 103b, 103c, 105, and 155. Opening 125 for example has the same shape as openings 121. In this example, there is formed at this step, for example in a peripheral region of the device, an opening 125 common to the photosensitive diodes D1 of the device, forming a cathode contacting opening of said diodes.

Conversely to openings 121, the lateral walls of opening 125 are not coated with an electrically-insulating layer.

Figure 1F:
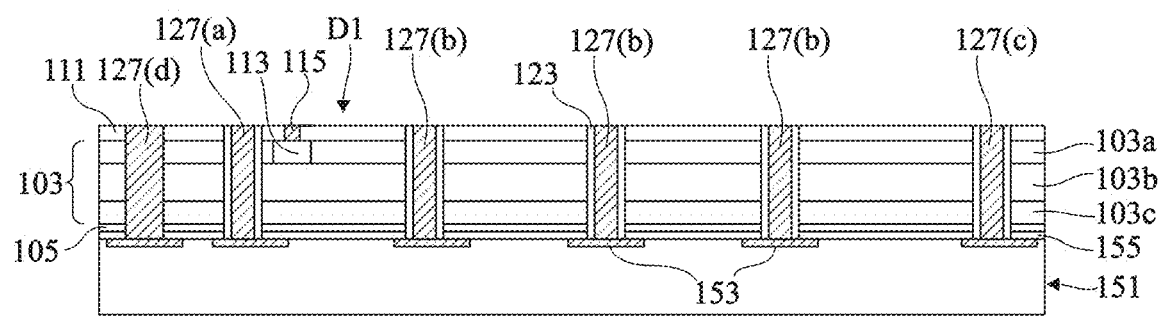

FIG. 1F illustrates a subsequent step of filling of openings 121(a), 121(b), 121(c), and 125 with metal, to form conductive vias 127(a), respectively 127(b), respectively 127(c), respectively 127(d). At the end of this step, a step of planarization of the upper surface of the structure, for example, a chemical-mechanical planarization (CMP), may be implemented, so that metallizations 115, 127(a), 127(b), 127(c), 127(d) are flush with the upper surface of dielectric layer 111.

In this example, the vias 127(a) of anode contacting of diodes D1, 127(b) of anode contacting of LEDs L1, L2, L3, and 127(c) of cathode contacting of LEDs L1, L2, L3, are insulated from the layers of stack 103 by lateral insulation layer 123. The cathode contacting via 127(d) of diodes D1 is however in contact, by its sides, with the semiconductor layers of stack 103.

Via 127(d) electrically connects the cathode layer 103c of the photosensitive diode stack to a cathode connection pad 153 of photosensitive diodes D1. It should be noted that since layers 103b and 103a of stack 103 are little or non-doped, the lateral contact between via 127(d) and said layers 103b, 103c causes no short-circuit of diodes D1. Doped layer 103c ensures the equipotential across the entire surface of the device.

Figure 1G:
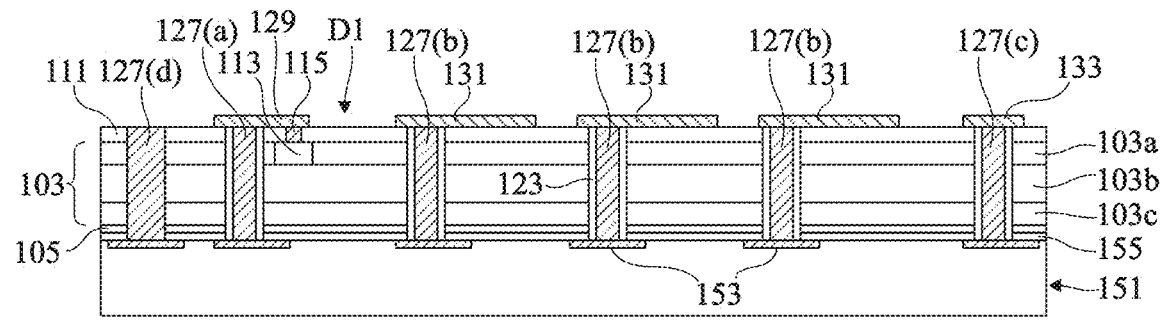

FIG. 1G illustrates the structure obtained at the end of a step of forming of metallizations on the upper surface of the structure of FIG. 1F. The metallizations formed at this step are in contact, by their lower surface, with the upper surface of dielectric layer 111 and with the underlying metallizations 127 or 115.

At this step, there is for example formed, for each diode D1, a metallization 129 electrically connecting the anode contacting via 127(a) of diode D1 to the anode contact metallization 115 of this diode.

Further, in this example, there is formed, for each LED L1, L2, L3, a metallization 131 substantially extending across the entire surface of the LED, corresponding to an anode electrode of the future LED, in contact, by its lower surface, with an anode contacting via 127(b) of the LED.

Further, in this example, there is formed a cathode contacting metallization 133 of the LEDs, in contact, by its lower surface, with the cathode contacting via 127(c) of the LEDs.

Metallizations 129, 131, and 133 are for example formed in a same metal level. As an example, a metal layer is first continuously deposited over the entire upper surface of the structure of FIG. 1F, and then locally removed by photolithography and etching while keeping metallizations 129, 131, and 133.

Figure 1H:
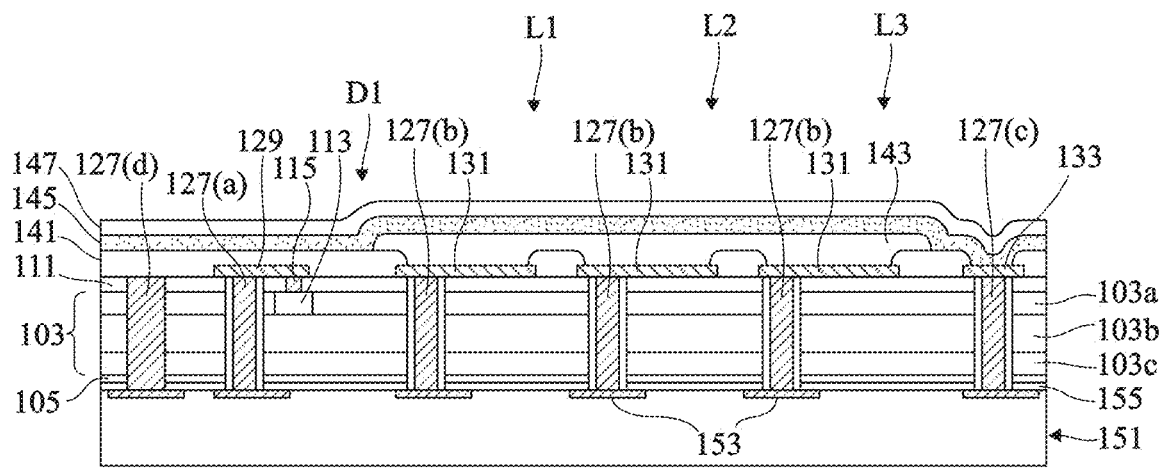

FIG. 1H illustrates the structure obtained at the end of steps of forming of organic LEDs L1, L2, L3 on the upper surface of the structure of FIG. 1G.

In this example, the organic LED forming method comprises the following successive steps:

i) deposition of a passivation layer 141 on the upper surface of the structure of FIG. 1G, and then local opening of layer 141 in front of metallizations 131 and 133;

ii) deposition of an active organic diode layer 143 (for example formed of a stack of injection, transport, and emission layers) on top of and in contact with the anode electrodes 131 of LEDs L1, L2, L3;

iii) deposition of a cathode electrode 145 of LEDs L1, L2, L3 on top of and in contact with the upper surface of active layer 143; and iv) deposition of an encapsulation layer 147 on top of and in contact with the upper surface of electrode 145.

The layer 141 deposited at step i) is for example a layer made of a polymer material, for example, a resin. As a variant, layer 141 may be made of silicon oxide. Layer 141 may be continuously deposited over the entire upper surface of the structure of FIG. 1G, and then locally removed, for example by photolithography and etching, to expose electrodes 131 and 133. In this example, metallizations 127(d) and 129 remain covered with layer 141. Further, in this example, the exposed portions of dielectric layer 111 are entirely covered with layer 141. More particularly, in this example, in top view, each of metallizations 133 and 135 is entirely surrounded and laterally separated from the other metallizations by portions of layer 141.

Active layer 143 may comprise a single layer made of a photosensitive organic material or a stack of a plurality of organic layers forming a photosensitive layer. In this example, layer 143 is a wide spectrum emission layer, for example, a white light emission layer. In this example, layer 143 is non-pixelated, that is, it extends continuously in front of the anode electrodes 133 of the LEDs L1, L2, L3 of the device. In the shown example, layer 143 does not extend in front of the photosensitive diodes D1 of the device. As an example, active layer 143 may be locally deposited by evaporation through a shadow mask. The three colors are the deposited separately and successively and there is no need to provide colored filters. As a variant, layer 143 may continuously extend over substantially the entire surface of the device, and in particular in front of photosensitive diodes D1. In this case, layer 143 may be deposited all over the surface, for example by spin coating. Preferably, layer 143 does not cover the cathode contacting electrode 133 of the LEDs.

Cathode electrode 145 for example extends continuously over the entire surface of the device. Electrode 145 is preferably made of a transparent conductive material, for example, of a transparent conductive oxide, for example, indium-tin oxide (ITO). At the periphery of the device, electrode 145 is in contact, by its lower surface, with the upper surface of the cathode contacting electrode 133 of the LEDs.

Encapsulation layer 147 aims at protecting active LED layer 143, particularly against humidity and oxygen. Layer 147 is preferably made of an electrically-insulating transparent material, for example, of aluminum oxide. Layer 147 for example extends continuously over the entire upper surface of the device. It may be formed by atomic layer deposition (ALD).

Figure 1I:
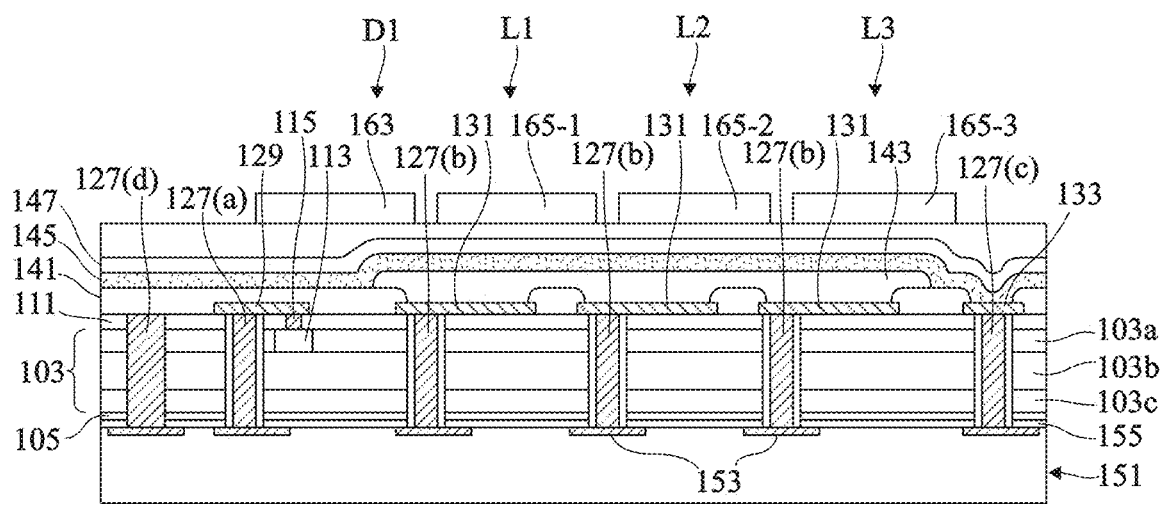

FIG. 1I illustrates the structure obtained at the end of steps of forming of filtering and/or color conversion elements on the upper surface of the structure of FIG. 1H.

As an example, a planarizing layer 151 made of a transparent material, for example, made of resin, is first deposited on the upper surface of the structure of FIG. 1H. In this example, layer 151 is in contact, by its lower surface, with the upper surface of encapsulation layer 147. Layer 151 has a substantially planar upper surface.

In this example, there is formed an optical filter 163 in front of photosensitive diode D1, and optical filters 165-1, 165-2, 165-3, respectively in front of LEDs L1, L2, and L3. Filter 163 is for example adapted to cutting off the visible radiation and to mainly letting through an infrared radiation. It should be noted that filter 163 may be replaced or combined with an optical element for shaping the incident light, for example, a microlens. Filters 165-1, 165-2, 165-3 are for example adapted to mainly letting through visible radiations in respectively three distinct wavelength ranges. As an example, filters 165-1, 165-2, 165-3 are adapted to mainly letting through red light, green light, and blue light. Filters 163, 165-1, 165-2, 165-3 are for example resin filters. As a variant, filters 165-1, 165-2, 165-3 may be replaced with photoluminescent color conversion elements. As an example, active layer 143 is a monochromatic emission layer, for example, a blue light emission layer. In this case, elements 165-1 and 165-2 are for example respectively a photoluminescent conversion element adapted to converting the blue light emitted by active layer 143 into red light, and a photoluminescent element adapted to converting the blue light emitted by active layer 143 into green light. In this configuration, element 165-3 may be omitted. LEDs L1, L2, and L3 thus define three emission pixels adapted to respectively emitting red light, green light, and blue light.

Thus, a device comprising one or a plurality of detection pixels each comprising a photosensitive diode D1 based on an inorganic semiconductor material, and one or a plurality of emission pixels each comprising an organic LED L1, L2, L3, is obtained, the assembly of the detection and emission pixels being controlled by a same integrated control circuit.

It should be noted that in the above-described example, organic active layer 143 is common to the different emissive pixels of the device, the differentiation of the colors being ensured by filters or color conversion elements in front of the organic LEDs of the different pixels. As a variant, organic active layers of distinct natures may be provided in the organic LEDs of the different pixels, to form LEDs L1, L2, L3 directly emitting in distinct wavelength ranges. In this case, filters 165-1, 165-2, 165-3 may be omitted.

Further, the described embodiments are not limited to the specific above-described example of a device comprising three types of distinct emissive pixels adapted to respectively emitting in three distinct wavelength ranges. As a variant, the device may comprise two or more than two emissive pixels respectively emitting in distinct wavelength ranges. In another variant, the device may be monochromatic in emission, that is, comprise a single type of emissive pixel. In this case, filters or color conversion elements 165-1, 165-2, 165-3 may be omitted.

Further, in the above-described example, the device is monochromatic in receive mode, that is, it comprises a single type of detection pixel, sensitive in a determined wavelength range. As a variant, the device may comprise a plurality of types of detection pixels adapted to measuring radiations in distinct wavelength ranges. The differentiation of the wavelength ranges may then be ensured by filters 163 of distinct natures in front of the different detection pixels. In another variant, optical filters 163 may be omitted in the case of a monochromatic device in receive mode.

Further, in the above-described example, the cathode contacting via 127(*d*) of photosensitive diodes D1 is common to the different diodes D1. As a variant, the device may comprise a specific cathode contacting via 127(*d*) per photosensitive diode D1.

Similarly, in the above-described example, cathode electrode 145 and cathode contacting via 127(*c*) are common to the different LEDs L1, L2, L3 of the device. As a variant, the device may comprise a specific cathode electrode 145 and/or a specific cathode contacting via 127(*c*) per LED.

In another variant, a single cathode contacting via, common to the LEDs and to the photosensitive diodes of the device, may be provided at the periphery of the device, the cathode electrodes of the LEDs and of the photosensitive diodes being then interconnected.

The method described in relation with FIGS. 1A to 1I may be used to form monolithic microdisplays, combining an image display function and an optical capture function, for example, to form an interactive display screen adapted to implementing functions of face or shape recognition, of motion detection, of identification, etc. An advantage of the described method is that it enables to form display pixels and capture pixels of small lateral dimensions, and thus obtain high display resolutions and capture resolutions. It should be noted that in the above-described example, the device comprises macropixels, each comprising a detection pixel and three emission pixels adapted to respectively emitting in three distinct wavelength ranges. In other words, the resolution of the device in emit mode and the resolution of the device in receive mode are identical. As a variant, the resolution of the display device and the resolution of the optical sensor may be different. In particular, the number of detection pixels may be smaller than the number of emission pixels of a same wavelength range.

As a variant, the method described in relation with FIGS. 1A to 1I may be used to form interactive display devices of larger dimensions, for example, a screen for a television, computer, smartphone, digital tablet, etc. Such a device may comprise a plurality of elementary electronic chips arranged, for example, according to an array layout, on a same transfer substrate. The elementary chips are rigidly assembled to the transfer substrate and connected to electric connection elements of the transfer substrate for their control. Each chip comprises one or a plurality of LEDs L1, L2, L3, one or a plurality of photosensitive diodes D1, and a circuit 151 for controlling said one or a plurality of LEDs and said one or a plurality of photosensitive diodes. Each chip for example corresponds to a macropixel of the device. As an example, each chip comprises three individually-controllable LEDs L1, L2, L3 respectively defining three emission pixels adapted to respectively emitting red light, green light, and blue light, and a photosensitive diode D1 adapted to detecting an infrared or near-infrared radiation, defining a detection pixel.

FIGS. 2A to 2G are cross-section views illustrating successive steps of an example of a method of manufacturing such a device.

Figure 2A:
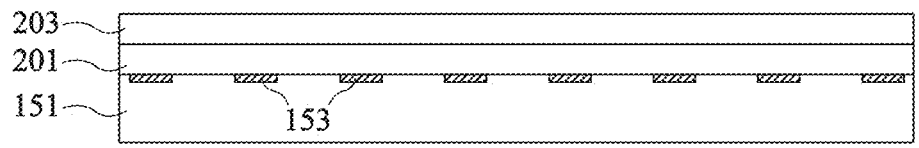
FIGS. 2A, 2B, 2C, 2D, 2E, 2F, and 2G are cross-section views illustrating other successive steps of an example of an optoelectronic device manufacturing method according to an embodiment.

FIG. 2A very schematically illustrates an initial structure which corresponds to a structure of the type obtained by the method of FIGS. 1A to 1I, comprising an integrated control circuit stage 151, topped with a photodetection stage 201, itself topped with an emission stage 203. Photodetection stage 201 comprises a plurality of photosensitive diodes D1 (not detailed in FIGS. 2A to 2G) individually controllable by integrated circuit 151. The emission stage comprises a plurality of LEDs L1, L2, L3 (not detailed in FIGS. 2A to 2G) individually controllable by integrated circuit 151. In FIG. 2A, only the electric connection pads 153 of integrated circuit 151, arranged on the upper surface side of integrated circuit 151, have been detailed.

Figure 2B:

FIG. 2B illustrates a step of bonding of the structure of FIG. 2A onto a temporary support substrate 210, for example, made of silicon. The structure of FIG. 2A is bonded to support substrate 210 by its surface opposite to integrated control circuit 151, that is, by its lower surface in the orientation of FIG. 2B, corresponding to its upper surface in the orientation of FIG. 2A.

Figure 2C:
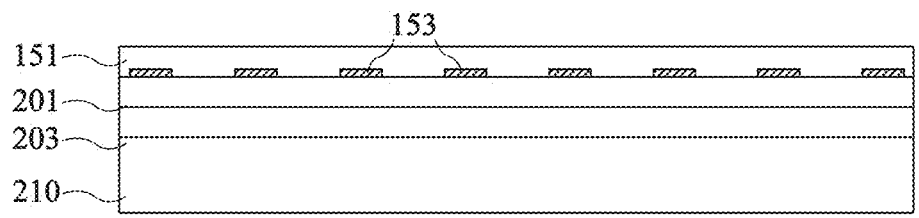

FIG. 2C illustrates an optional step of thinning of the semiconductor substrate of integrated circuit 151, from its surface opposite to stages 201 and 203. As an example, integrated circuit 151 is initially formed inside and on top of a substrate of SOI ("Semiconductor On Insulator") type. The SOI substrate for example comprises a silicon support, coated with an insulating layer, itself coated with a single-crystal silicon layer (not detailed in the drawings). The components, particularly transistors, of integrated circuit 151, may be formed inside and on top of the single-crystal silicon layer of the SOI substrate. The thinning step of FIG. 2C may comprise removing the support substrate from the SOI substrate, to only keep the single-crystal silicon layer and the insulating layer of the SOI substrate.

As a variant, integrated circuit 151 is formed inside and on top of a solid silicon substrate, and the thinning step may then comprise decreasing the substrate thickness, for example, by grinding, from its upper substrate (in the orientation of FIG. 2C). An insulating passivation layer (not detailed in the drawing) may then be deposited on the upper surface of the thinned substrate.

Figure 2D:
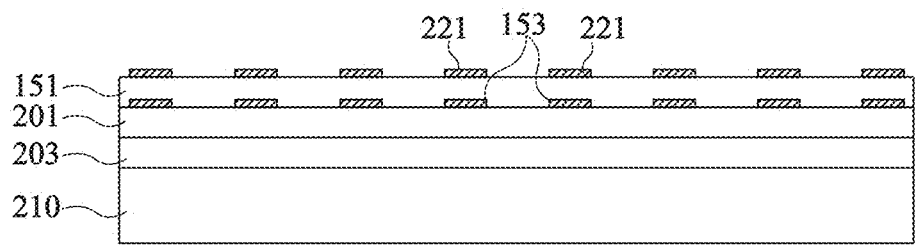

FIG. 2D illustrates a step of forming, on the upper surface side of integrated circuit 151, of metal connection pads 221 coupled to connection pads 153 and/or to connection terminals of electronic components, for example, MOS transistors, of integrated circuit 151, by means of conductive vias, not detailed in the drawing, crossing the semiconductor substrate of integrated circuit 151. Pads 221 being for the most part coupled to connection terminals inside of the circuit, their number is in practice greater than the number of pads 153.

Figure 2E:
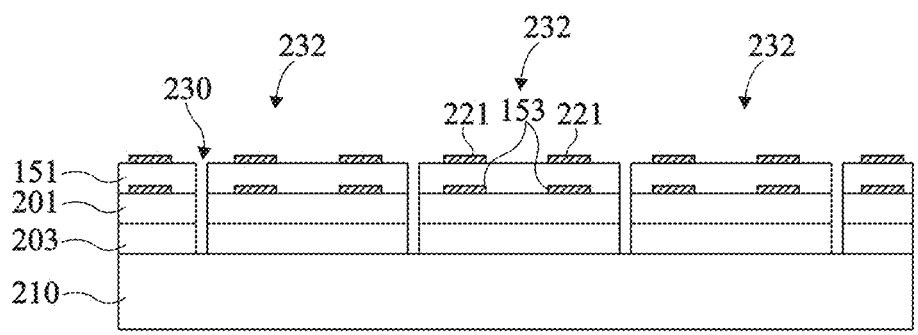

FIG. 2E illustrates a step of forming, from the upper surface of integrated circuit 151, of trenches 230 vertically crossing integrated circuit 151, detection stage 201, and emission stage 203, and emerging onto the upper surface of temporary support substrate 210. Trenches 230 laterally delimit a plurality of semiconductor chips 232 corresponding to the elementary chips of the pixel of the display device. Trenches 230 may be formed by plasma etching, by sawing, or by any other adapted cutting method.

Figure 2F:
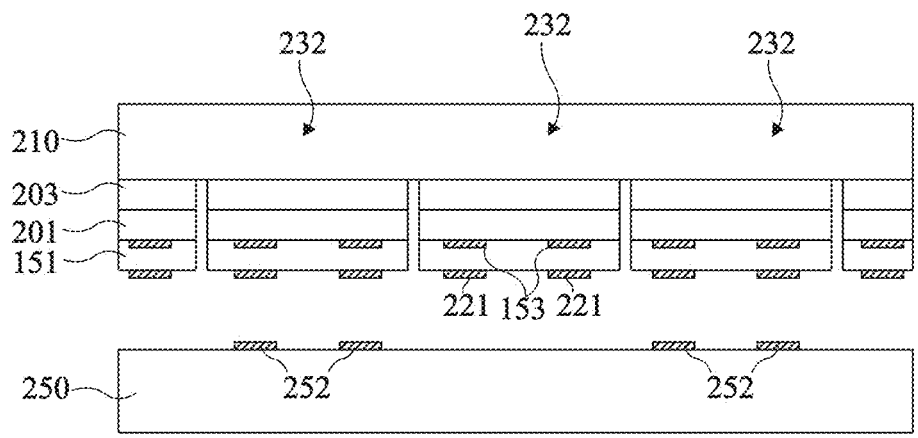
Figure 2G:
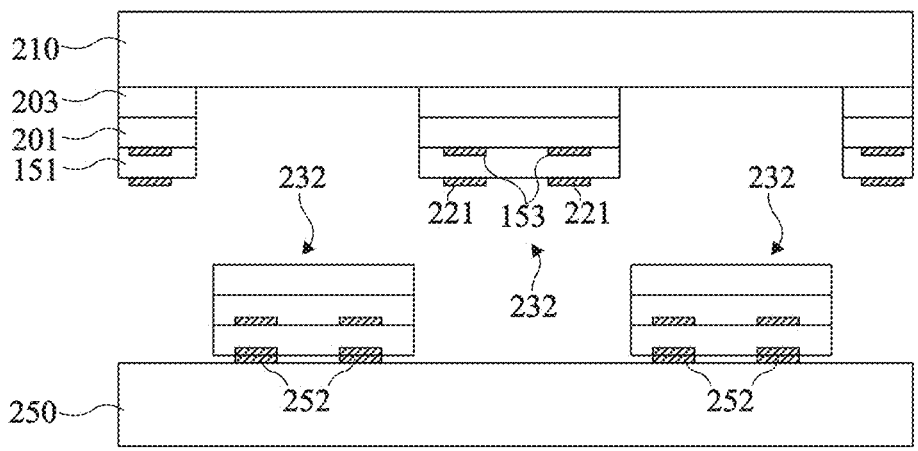

FIGS. 2F and 2G illustrate a step of bonding of elementary chips 232 onto the upper surface of a same transfer substrate 250 of the display device. Transfer substrate 250 comprises, on its upper surface side, a plurality of metal connection pads 252, intended to be bonded and electrically and mechanically connected to corresponding metal connection pads 221 of the elementary chips 232.

The structure of FIG. 2E is turned upside down (FIG. 2F) to place the metal connection pads 221 of elementary chips 232 in front of corresponding metal connection pads 252 of transfer substrate 250. Opposite pads 221 and 252 are then bonded and electrically connected, for example, by direct bonding, by welding, by means of microtubes, or by any other adapted method.

Once bonded to transfer substrate 250, elementary chips 232 are separated from temporary support substrate 210, and the latter is removed (FIG. 2G). As an example, the separation of the chips is performed by mechanical separation or by separation by means of laser beam.

In the shown example, the pitch (center-to-center distance in front view) of the elementary chips 232 on transfer substrate 250 is a multiple of the pitch of the elementary chips 232 on the substrate. Thus, only part of elementary chips 232 (one out of two in the shown example) are simultaneously transferred from temporary support substrate 210 to transfer substrate 250. The other chips 232 remain attached to temporary transfer substrate 210 and may be subsequently transferred onto another portion of transfer substrate 250 or onto another transfer substrate 250.

Various embodiments and variants have been described. Those skilled in the art will understand that certain features of these various embodiments and variants may be combined, and other variants will occur to those skilled in the art. In particular, the described embodiments are not limited to the examples of materials and/or of dimensions mentioned in the present disclosure.

Further, in the example described in relation with FIGS. 1A to 1I, the anode regions 113 and the anode metallizations 115 of the photosensitive diodes are formed after the transfer of active photosensitive diode stack 103 onto integrated control circuit 151. As a variant, not detailed in the drawings, the anode regions 113 and the anode metallizations 115 of the photosensitive diodes may be formed before the transfer of active photosensitive diode stack 103 onto active LED stack 113. In this case, the order of the layers of stack 103 is inverted with respect to the example of FIG. 1A. An advantage is that the anneal of activation of the dopants of region 113 may be performed before the transfer of stack 103 onto integrated circuit 151, which avoids any degradation of circuit 151 or of the bonding between stack 103 and circuit 151 during the anneal.

Figure 3:
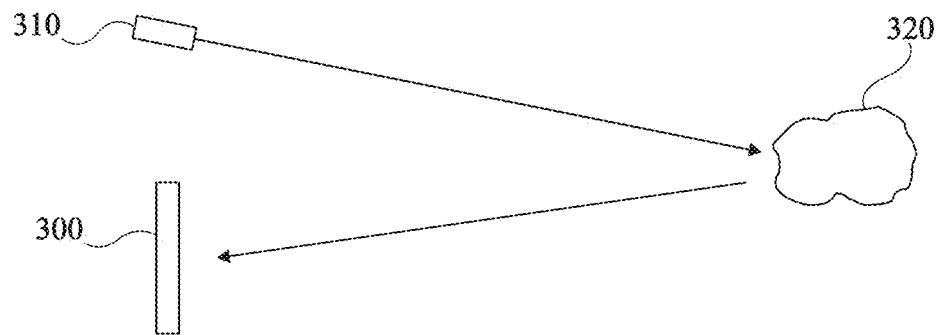
FIG. 3 schematically shows an example of a system comprising an optoelectronic device according to an embodiment.

FIG. 3 schematically shows an example of a system comprising an optoelectronic device 300 according to an embodiment.

Device 300 may be a device of monolithic microdisplay type, for example formed by a method of the type described in relation with FIGS. 1A to 1I.

As a variant, device 300 may be a device of larger dimensions, for example formed by a method of the type described in relation with FIGS. 2A to 2G.

Device 300 combines an image display function and an optical capture function, for example, to form an interactive display screen adapted to implementing functions of face or shape recognition, of motion detection, of identification, etc.

The system of FIG. 3 further comprises a light source 310. Source 310 is adapted to emitting a light radiation in the range of sensitivity of the photosensitive diodes D1 (not detailed in FIG. 3) of device 300. As an example, source 310 is an infrared source, for example, a laser source.

In operation, source 310 illuminates a scene 320, an image of which is desired to be acquired. The light emitted by source 310 is reflected by scene 320 and returned to device 300. The photosensitive diodes D1 of device 300 then enable to acquire an image of scene 320 and/or to measure depth information relative to scene 320.

In the example of FIG. 3, light source 310 is a remote source, that is, it is distinct from device 300. The control of light source 310 and the control of the detection pixels of device 300 are for example synchronized.

Figure 4:
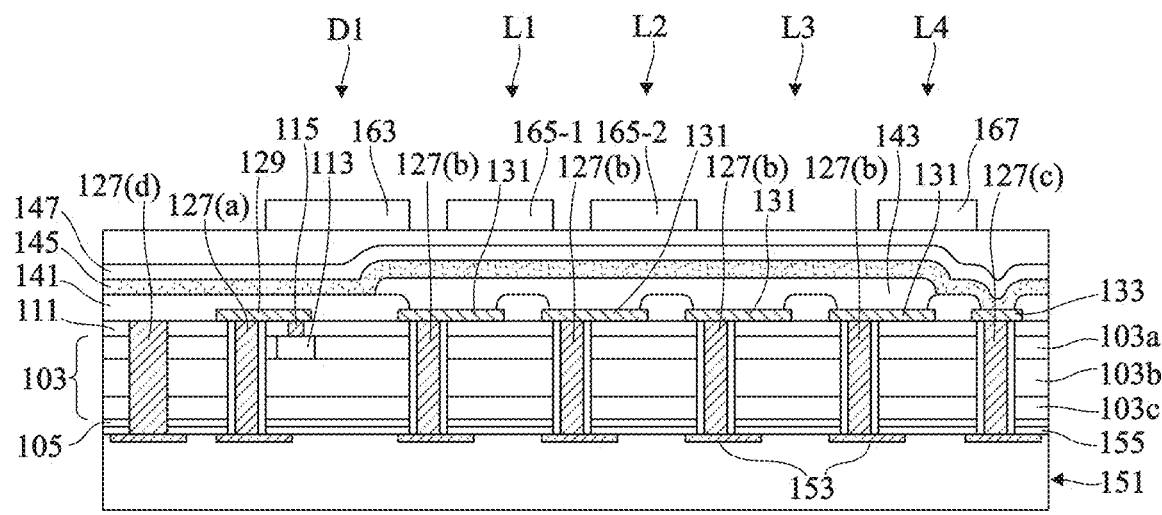
FIG. 4 is a cross-section view schematically and partially illustrating another example of an optoelectronic device according to an embodiment.

FIG. 4 is a cross-section view schematically and partially illustrating another example of an optoelectronic device according to an embodiment.

In this example, the optoelectronic device integrates a distributed light source emitting in the sensitivity range of photodiodes D1, for example, an infrared source. This enables to do away with the remote source 310 of the system of FIG. 3.

The device of FIG. 4 comprises elements common with the device of FIG. 1I. These elements will not be detailed again hereafter, and only the differences with respect to the device of FIG. 1I will be highlighted.

In this example, active layer 143 is a monochromatic emission layer. More particularly, in this example, active layer 143 is a blue light emission layer. The described embodiments are however not limited to this specific example. Those skilled in the art will be capable of adapting the example of embodiment described in relation with FIG. 4 to other emission colors of active layer 143.

In the example of FIG. 4, element 165-1 is a photoluminescent conversion element adapted to converting the blue light emitted by active layer 143 into red light, and element 165-2 is a photoluminescent element adapted to converting the blue light emitted by active layer 143 into green light. In this example, element 165-3 is omitted. Thus, LEDs L1, L2, and L3 respectively define a red light emission pixel, a green light emission pixel, and a blue light emission pixel.

In the example of FIG. 4, the device further comprises a fourth organic LED L4, for example, identical or similar to organic LEDs L1, L2, and L3, individually controllable. LED L4 is topped with a photoluminescent element 167, adapted to converting the blue light emitted by active layer 143 into a light radiation having a wavelength within the detection range of photosensitive diode D1, for example, an infrared radiation.

Thus, LED L4 defines an emissive pixel of a light source adapted to cooperating with photosensitive diodes D1 and replacing the source 310 of the system of FIG. 3.

As previously described, the device of FIG. 4 may be a device of monolithic microdisplay type, or a pixel of a device of larger dimensions.

The number and the repetition pitch of organic LEDs L4 may be selected according to the needs of the application. For example, there may be provided one LED L4 per visible emission pixel, or one LED D4 per photosensitive diode D1, or a different distribution. For example, the device may comprise less LEDs L4 than visible LEDs L1, L2, or L3. Preferably, the final device (monolithic microdisplay or extensive device) comprises a plurality of LEDs L4 distributed over the surface of the device.

The conversion elements 165-1, 165-2, and 167 topping LEDs L1 and L2 are for example formed based on quantum dots or based on perovskite materials. The conversion elements based on perovskite materials are for example deposited by pulsed laser deposition (PLD).

The invention claimed is:

1. Optoelectronic device manufacturing method, comprising the successive steps of:

a) transferring an active inorganic photosensitive diode stack onto an integrated control circuit previously formed inside and on top of a first semiconductor substrate; and b) forming a plurality of organic light-emitting diodes on the active photosensitive diode stack, wherein, at the end of step a), the active photosensitive diode stack continuously extends over the entire surface of the integrated control circuit, the method further comprising, after step a) and before step b), the forming of conductive contacting vias crossing the active photosensitive diode stack and emerging onto metal connection pads of the integration control circuit, and wherein, at the end of step b), the organic light-emitting diodes are connected to the integrated control circuit via said conductive vias.

2. Method according to claim 1, comprising the forming of a plurality of a photosensitive diodes in the active photosensitive diode stack.

3. Method according to claim 1, wherein, at step a), the active photosensitive diode stack is fixed to the integrated control circuit by direct bonding of a dielectric layer previously deposited on the active photosensitive diode stack, with a dielectric layer previously deposited on the integrated control circuit.

4. Method according to claim 1, comprising, after step b), the forming of optical filters or of color conversion elements above the organic light-emitting diodes.

5. Method according to claim 2, comprising, after step b), the forming of optical filters or of color conversion elements above the organic light-emitting diodes, wherein said organic light-emitting diodes are monochromatic diodes of same color, at least one of said organic light-emitting diodes being topped with a photoluminescent conversion element adapted to converting the light emitted by the diode into a visible wavelength and at least another one of said organic light-emitting diodes being topped with a photoluminescent conversion element adapted to converting the light emitted by the diode into a light radiation in the wavelength range detected by said photosensitive diodes, preferably an infrared radiation.

6. Method according to claim 5, wherein at least one of said organic light-emitting diodes is not topped with a photoluminescent conversion element.

7. Method according to claim 4, wherein said organic light-emitting diodes are adapted to mainly emitting blue light.

8. Method according to claim 5, wherein said photoluminescent conversion elements are formed based on quantum dots or on perovskite materials.

9. Method according to claim 1, wherein the active photosensitive diode stack comprises at least one semiconductor layer made of a III-V material.

10. Method according to claim 1, wherein the active photosensitive diode stack comprises first, second, and third semiconductor layers, the second layer being arranged between the first and third layers, and the third layer being arranged on the side of the integrated control circuit at the end of step a).

11. Method according to claim 10, comprising a step of P-type doping of local portions of the first layer, said portions defining anode regions of photosensitive diodes of the device.

12. Method according to claim 11, wherein said step of P-type doping of local portions of the first layer is implemented after step a) and before step b).

13. Method according to claim 12, further comprising, after said step of P-type doping of local portions of the first layer and before step b), a step of forming of connection metallizations on top of and in contact with said local portions of the first layer.

14. Method according to claim 1, comprising, after step b), a step of bonding of a temporary support substrate onto the side of a surface the device opposite to the integrated circuit, followed by a step of cutting of the assembly comprising the integrated circuit, the active photosensitive diode stack, and the organic light-emitting diodes into a plurality of elementary chips.

15. Method according to claim 14, further comprising a step of transfer and of bonding of said elementary chips onto a transfer substrate of the device, followed by a step of removal of the temporary support substrate.

16. Display device comprising a transfer substrate and a plurality of elementary chips bonded and electrically connected to the transfer substrate, each elementary chip comprising an optoelectronic device formed by a method according to claim 1, the integrated control circuit of each elementary chip being arranged on the side of the transfer substrate.

17. System comprising a display device according to claim 16, and a light source adapted to emitting a light radiation in the wavelength range detected by said inorganic photosensitive diodes, preferably an infrared radiation.

18. System according to claim 17, wherein the light source is a remote source.

19. System according to claim 17, wherein the light source is integrated to the display device and comprises at least one organic light-emitting diode of an elementary chip of the display device.

* * * * *